United States Patent [19]

Kozlovsky

[11] Patent Number: 5,254,502
[45] Date of Patent: Oct. 19, 1993

[54] METHOD FOR MAKING A LASER SCREEN FOR A CATHODE-RAY TUBE

[75] Inventor: Vladmir I. Kozlovsky, Troisk, U.S.S.R.

[73] Assignees: Principia Optics, Inc., Temple City, Calif.; P. N. Lebeder Institute of Physics, Moscow, U.S.S.R.

[21] Appl. No.: 858,617

[22] Filed: Mar. 27, 1992

[51] Int. Cl.$^5$ .......................................... H01L 21/302
[52] U.S. Cl. ........................................ 437/225; 437/5; 437/7; 437/234; 437/974; 148/DIG. 12; 148/DIG. 135
[58] Field of Search .................. 437/225, 7, 974, 181, 437/234, 233, 906, 226; 148/135, DIG. 12; 156/626, 636, 652, 657

[56] References Cited

U.S. PATENT DOCUMENTS

| 3,558,956 | 1/1971 | Bosev et al. | |
|---|---|---|---|
| 3,959,584 | 5/1976 | Todd, Jr. | |
| 3,986,194 | 10/1976 | Masumoto et al. | 357/18 |
| 3,993,800 | 11/1976 | Callender | 437/225 |
| 3,996,492 | 12/1976 | McGroddy | 313/500 |
| 4,140,941 | 2/1979 | Uemura | 313/495 |
| 4,479,222 | 10/1984 | Hawrylo | |
| 4,482,424 | 11/1984 | Katzir et al. | 156/643 |
| 4,523,212 | 6/1985 | Hawrylo | 357/17 |
| 4,539,687 | 9/1985 | Gordon et al. | |
| 4,565,947 | 1/1986 | Minn | 313/467 |
| 4,571,727 | 2/1986 | Nishizawa et al. | |
| 4,626,739 | 12/1986 | Shmulovich | 313/469 |
| 4,695,332 | 9/1987 | Gordon et al. | 437/126 |
| 4,813,049 | 3/1989 | Becla | |
| 4,879,258 | 11/1989 | Fisher | 156/636 |
| 4,894,832 | 1/1990 | Colak | |
| 4,955,031 | 9/1990 | Jain | |
| 4,966,862 | 10/1990 | Edmond | 437/181 |

FOREIGN PATENT DOCUMENTS

| 0356218 | 2/1990 | European Pat. Off. | 437/225 |
|---|---|---|---|
| 2267949 | 11/1990 | Japan | 148/DIG. 12 |
| 3141660 | 6/1991 | Japan | 437/225 |

OTHER PUBLICATIONS

A. S. Nasibov and E. S. Shemchuk, Use of Laser Electron-Beam Tubes In Projection Television, Sov. J. Quantum Electron, Sep., 1978, pp. 1080-1085.

Primary Examiner—Brian E. Hearn
Assistant Examiner—Michael Trinh
Attorney, Agent, or Firm—Marshall A. Lerner

[57] ABSTRACT

A method for making a laser screen for a cathode-ray tube involves forming a partly transparent mirror of a material resistant to etching solutions on a polished side of a semiconductor member to cover a part of the surface area of the polished side of the semiconductor member surrounding an image forming area. A layer of the semiconductor member of a thickness of 20 to 50 μm is etched off on this polished side to define a support surface surrounding the image forming area which is equally spaced from the outer surface of the partly transparent mirror. A transparent support member is cemented to the outer surface of the partly transparent mirror. The other side of the semiconductor member opposite to the support member is polished, and a reflecting mirror is formed on this surface.

15 Claims, 2 Drawing Sheets

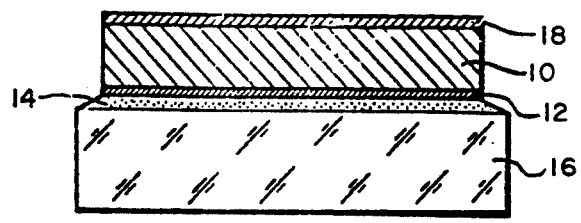
Fig. 1
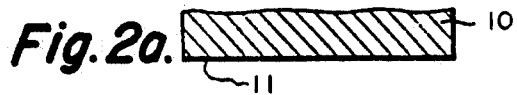
Fig. 2a.
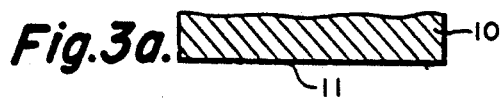
Fig. 3a.
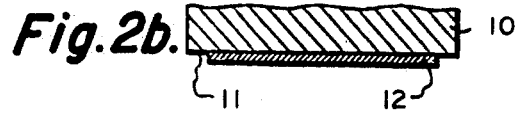
Fig. 2b.
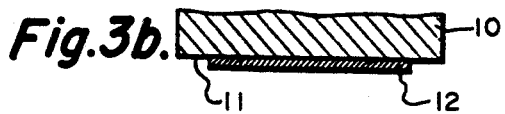
Fig. 3b.
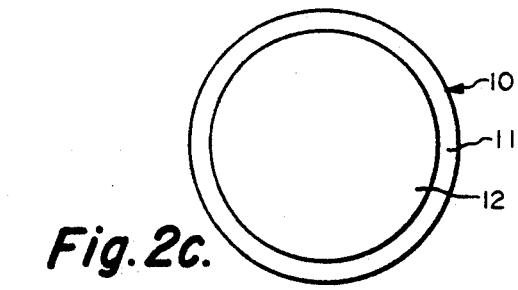
Fig. 2c.
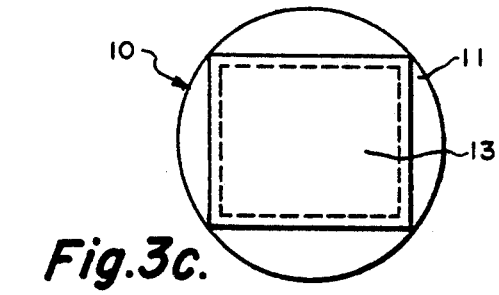
Fig. 3c.
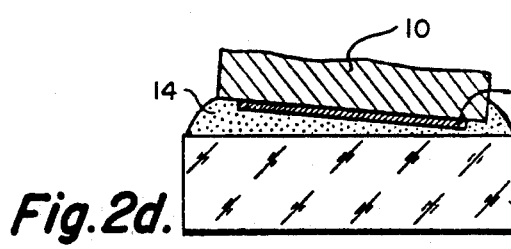
Fig. 2d.
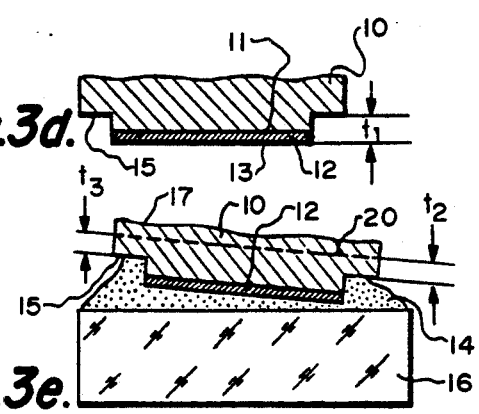
Fig. 3d.
Fig. 3e.
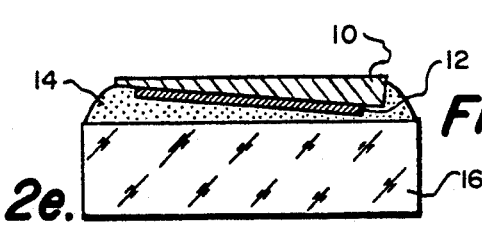
Fig. 2e.
Fig. 3f.
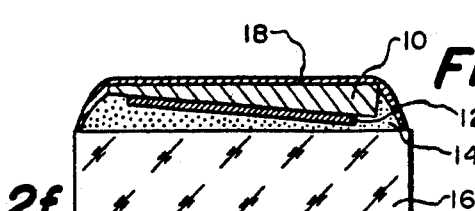
Fig. 2f.
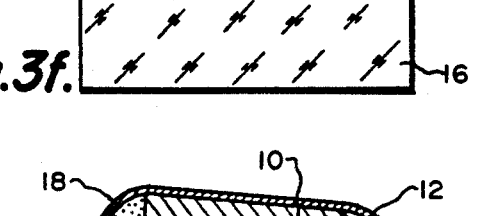
Fig. 3g.

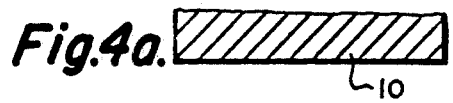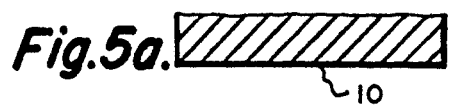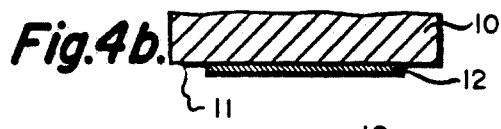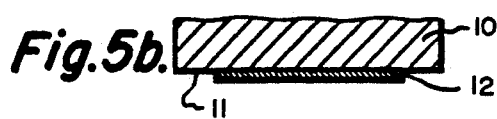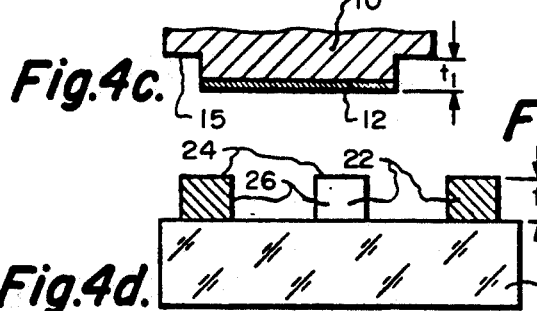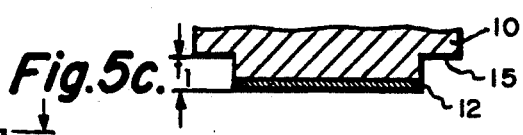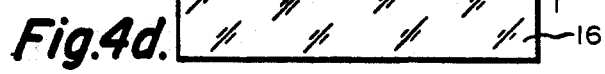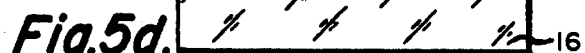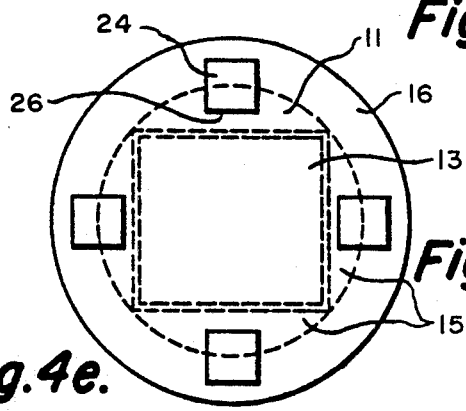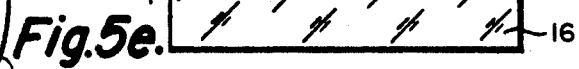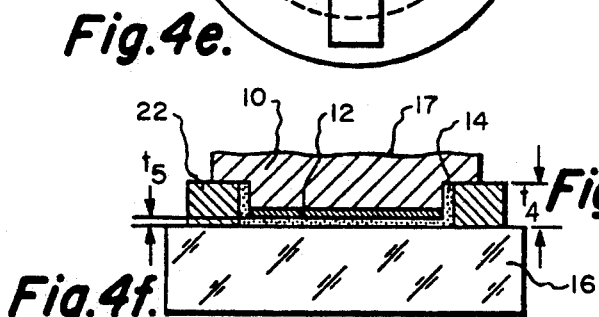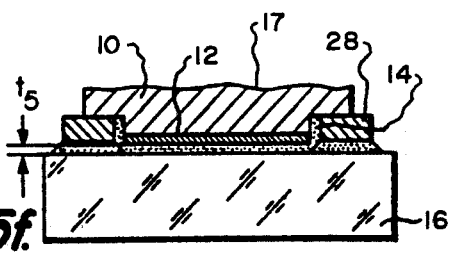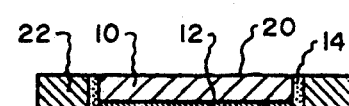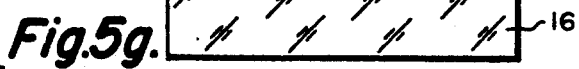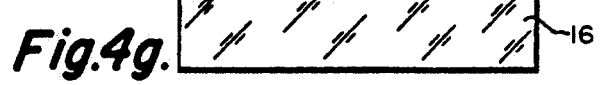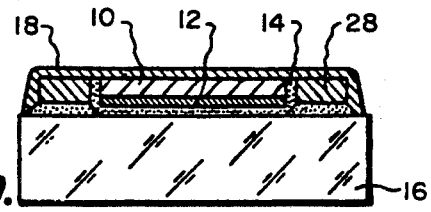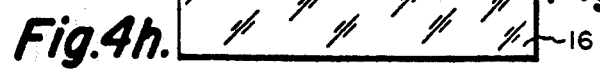

METHOD FOR MAKING A LASER SCREEN FOR A CATHODE-RAY TUBE

FIELD OF THE INVENTION

The invention relates to electronic equipment. More particularly, the invention deals with a method for making a laser screen for a cathode-ray tube in which laser radiation is generated at any point of a laser screen upon which an electron beam is incident. The invention may be used in high-brightness kinescopes and in particular in projection TV systems.

BACKGROUND OF THE INVENTION

It is known to make a laser screen for a cathode-ray tube by a method comprising polishing one side of a semiconductor member, depositing a partly transparent mirror on this side of the semiconductor member, cementing the resulting structure to a transparent heat removing support, polishing the opposite side of the semiconductor member, and depositing an electrically conducting reflecting mirror to this side of the semiconductor member (V. I. Kozlovsky et al. Laser Screens of CdS, $CdS_xSe_{1-x}$, ZnSe Monocrystalline Ingots. (In Russian). Moscow. J. Kvantovaya elektronika. Vol. 4. No. 2. 1977. pp. 351-354). This method is used for making laser screens with a diameter of the lasing surface of 50 mm and greater. The semiconductor member is only 40 $\mu$m thick after its final treatment, and a thickness of a cementing layer is maximum 20 $\mu$m. It is only the total thickness of the cementing layer and semiconductor member that can be controlled with reference to the surface of the transparent heat removing support. As thickness values of the cementing layer and semiconductor member cannot be controlled independently the yield of normal grade laser screens is rather low. With an increase in thickness of the semiconductor member efficiency of transformation of electron beam energy into luminous energy decreases, and a decrease in this thickness results in a shorter service life of the laser screen. If thickness of the cementing layer is too big, heat conductance of this layer decreases which causes a change in a radiation wavelength. The semiconductor member is overheated thus lowering the efficiency of energy transformation. If the cementing layer thickness is too small, its flexibility and ultimate strength under shear stresses decrease, and the laser screen life becomes shorter. It should be also noted that non-uniformity of thickness of the cementing layer and semiconductor member (e.g., a taper of either or both of them) results in non-uniformity of the laser screen and in a shorter service life of the screen.

SUMMARY OF THE INVENTION

It is an object of the invention to provide a method for making a laser screen for a cathode-ray tube which involves steps allowing dimensional parameters of component members of a laser screen to be controlled during its manufacture to enhance laser screen quality.

It is another object of the invention to improve uniformity of a laser screen. Still another object of the invention is to prolong service life of a laser screen. Finally, it is an object of the invention to provide a simple and reliable method of making a laser screen for a cathode-ray tube ensuring high quality of image.

With these and other objects in view, in a method for making a laser screen for a cathode-ray tube having an optical cavity formed by a reflecting mirror and a partly transparent mirror, a semiconductor member between the mirrors, and a support and heat removing means made of a transparent material, according to the invention, one side of the semiconductor member is polished and the partly transparent mirror of a material resistant to etching solutions is formed on the polished side of the semiconductor member. The partly transparent mirror covers a part of the surface area of the polished side of the semiconductor member surrounding an image forming area. A layer of the semiconductor member of a thickness of 20 to 50 $\mu$m is then etched off on the polished side of the semiconductor member to define a support surface of the semiconductor member surrounding the image forming area. This support surface is equally spaced from the outer surface of the partly transparent mirror. The support means is attached to the outer surface of the partly transparent mirror. The other side of the semiconductor member opposite to the support is then polished, and the reflecting mirror is formed on this side of the semiconductor member.

With such a method, a support surface is formed on the semiconductor member to surround the image forming area and to be equally spaced from the outer surface of the partly transparent mirror. In other words, the support surface, which is thus formed, can be used as a datum surface for subsequent polishing of the other side of the semiconductor member when the partly transparent mirror is cemented to the heat removing support member. It will be understood that after cementing the partly transparent mirror to the support member, one cannot use the mirror side as a datum surface for checking up the semiconductor member for uniformity of thickness. Since normal procedures for cementing a semiconductor member to a support member do not allow taper of the semiconductor member to be adequately controlled, it is not possible to correct this taper in polishing the other side of the semiconductor member which has to be parallel with the side of this semiconductor member cemented to the support member. The method according to the invention allows such control to be carried out because the semiconductor member rests upon the cementing layer along its periphery with the support surface formed by etching off a layer of the semiconductor member. This support surface can be exposed after cementing to such an extent as to allow one to measure the distance from the support surface to the exposed surface of the semiconductor member at any point along the periphery of the semiconductor member. Since the support surface is equally spaced from the surface of the partly transparent mirror, this measurement allows machining or other treatment of the exposed surface of the semiconductor member to be carried out in such a manner as to make this surface to run strictly in parallel with the surface of the semiconductor member to which the partly transparent mirror is applied. An alternative procedure may consist in grinding and polishing the exposed side of the semiconductor member until the surface of the cementing layer covered by the support surface of the semiconductor member is exposed.

This ensures high uniformity of image owing to uniform thickness of the semiconductor member.

According to the invention, the method involves placing support means on the surface of the support member before cementing the semiconductor member to the support member, the top side of the support means being equally spaced from the top side of the support member. This allows the cement layer between the semiconductor member and the support member to be made of uniform thickness so as to enhance uniformity of image.

In other embodiments of the invention, the height of the support means is chosen taking into account thickness of the etched-off layer of the semiconductor member so as to ensure a preset thickness of the cementing layer between the support member and the semiconductor member. This allows the cementing layer thickness to be strictly controlled during manufacture so as to increase efficiency of energy transformation in a laser screen according to the invention.

DESCRIPTION OF THE DRAWINGS

Specific non-limiting embodiments of the invention will now be described with reference to the accompanying drawings, in which identical details are shown at identical reference numerals and in which:

FIG. 1 shows a sectional view of a laser screen for a cathode-ray tube made by a method according to the invention;

FIG. 2(a-f) illustrate steps of a prior art method for making a laser screen for a cathode-ray tube;

FIG. 3(a-g) illustrate steps of a method for making a laser screen for a cathode-ray tube according to the invention;

FIG. 4(a-h) illustrate steps of an embodiment of a method for making a laser screen for a cathode-ray tube according to the invention;

FIG. 5(a-h) illustrate steps of another embodiment of a method for making a laser screen for a cathode-ray tube according to the invention.

DESCRIPTION OF PREFERRED EMBODIMENTS

With reference to FIG. 1, a laser screen for a cathode-ray has a semiconductor member 10 and a partly transparent mirror 12 attached by means of a cementing layer 14 to a heat removing support member 16 which is made of a suitable material such as sapphire. The cementing layer is usually a transparent epoxy glue with shear stress capability of at least 1 kg per sq. mm in a temperature range from $-200°$ C. to $150°$ C. The glue is referred to in Russia as OK-72F optical glue which satisfies these requirements. A reflecting mirror 18 defines an optical cavity with partly transparent mirror 12. Semiconductor member 10 is in the form of a single-crystal wafer generally of a semiconductor compound of the type $A^{II}B^{VI}$, e.g., CdS, ZnSe, CdSSe, ZnCdS, ZnCdSe, and the like. Specific materials of which the above-mentioned components of the laser screen are made do not have material bearing on this invention if not otherwise specified below.

As it is well known to those skilled in the art, when an electron beam is incident upon the above-described laser screen, laser radiation is generated in the optical cavity formed by the pair of mirrors 12 and 18 to produce an image visible through transparent support member 16. Such screens were generally made by a prior art method illustrated in FIG. 2 in which FIG. 2(a) shows semiconductor member 10 after polishing of one side 11. FIG. 2(b) shows the semiconductor member with a partly transparent mirror deposited on its side 11 as can also be seen in FIG. 2(c) showing a bottom view of semiconductor member 10 of FIG. 2(b). FIG. 2(d) shows a step of cementing semiconductor member 10 with partly transparent mirror 12 by means of cementing layer 14 to transparent support member 16. FIGS. 2(e,f) show the steps of polishing of the top side of semiconductor member 10 (FIG. 2(e)) and formation of reflecting mirror 18 on the top side of semiconductor member 10 (FIG. 2(f)). It can be seen in FIG. 2(f) that both semiconductor member 10 and cementing layer 14 are tapered.

As shown in FIG. 3(a), which illustrates the method according to the invention, semiconductor member 10 is polished on its side 11 and as shown in FIG. 3(b) partly transparent mirror 12 is deposited to side 11 to form a component of a laser screen shown in a bottom view in FIG. 3(c). Partly transparent mirror 12 in this case is made of a material resistant to etching solutions so that it can be used as a mask for the purposes to be explained below. This mask defines an image forming area 13 which in this embodiment is shown as a rectangle. It is understood that image forming area 13 may be of any configuration suitable for a specific application of a laser screen and this configuration does not have any material bearing on this invention.

As shown in FIG. 3(d), a layer of material is etched off on side 11 of semiconductor member 10 in the area surrounding its image forming area 13 shown in FIG. 3(c). Thickness $t_1$ of the etched-off layer preferably ranges from 20 to 50 $\mu$m. The lower limit is set forth taking into account the depth of penetration of electron beam into the semiconductor component of the laser screen. This depth ranges from 10 to 15 $\mu$m. It is understood that thickness of the etched-off layer of the semiconductor member actually defines the final thickness of the semiconductor member. If thickness of the etched-off layer is smaller than 20 $\mu$m, an electron beam can cause degrading of the cementing layer so that service life of the laser screen is shortened. On the other hand, operating performance of a laser screen is very thickness-dependent. For this reason, it is preferred that thickness of the semiconductor member be commensurable with the penetration depth of an electron beam in operation at room temperature. However, if the screen is cooled to 100K to raise lasing power, thickness can be increased. It should be noted that with a thickness over 50 $\mu$m the generation threshold substantially increases so as to lower lasing efficiency.

This etching step is carried out with partly transparent mirror 12 being used as a mask so that no special mask is needed. As a result, a support surface 15 is formed around image forming area 13 (FIGS. 3(c,d)) This surface 15 is equally spaced from the surface of image forming area 13 or, which is the same, from the surface of partly transparent mirror 12. In other words, distance $t_1$ (FIG. 3(d)) from the surface of partly transparent mirror 12 to support surface 15 remains unchanged at any point of this support surface for the purposes to be explained below.

The next step is to cement the structure shown in FIG. 3(d) by means of cementing layer 14 to transparent support member 16 as shown in FIG. 3(e). This is done by applying a layer of a cementing composition to the top side of support member 16 and placing semiconductor member 10 onto this cementing layer with partly transparent mirror 12 facing toward transparent support member 16. As a result of this step a structure shown in FIG. 3(e) is obtained, and support surface 15 can be at least partly exposed as shown either by removing an excess of cementing composition or by making use of such procedure of cementing which allows this surface to be partly exposed. Cementing compositions and cementing procedures used in making laser screens of this type are well known to those skilled in the art.

The next step is to polish the exposed surface of semiconductor member 10 or surface 17 in FIG. 3(e). Irrespective of a procedure used for carrying out this step, the exposed portions of support surface 15 can be used as datum surfaces so that the position of the top plane of semiconductor member 10 shown by dotted line 20 in FIG. 3(e) can be controlled at any point. Distances from surface 15 to this top plane 20 of the top side should be identical, i.e., $t_2=t_3$ as support surface 15 is equally spaced from the surface of partly transparent mirror 12. This results in plane 20 being equally spaced from the surface of partly transparent mirror 12 so that surface 20 of the semiconductor member shown in FIG. 3(f) is also equally spaced from the surface of partly transparent mirror 12 cemented to transparent support 16. The most simple way of carrying out this procedure is to check-up the polishing operation by fully exposing the surface of the cementing layer which is initially covered by support surface 15 of the semiconductor member. This procedure is carried out with a visual check-up. When the cementing layer is about to be exposed, which can be seen by a slight change in color of the surface being polished at any point around the periphery of semiconductor member 10, the polishing operation must be carefully controlled to ensure a uniform change in color around the periphery of the semiconductor member.

It will be understood that, after depositing reflecting mirror 18 to surface 17 of semiconductor member 10, a resulting optical cavity consisting of mirrors 12 and 18 presents a plane-parallel structure which enhances uniformity of image and improves efficiency of energy transformation.

It can be seen from FIG. 3 that although a better optical cavity with parallel mirrors 12 and 18 is produced, cementing layer 14 has a taper and its thickness cannot be controlled during manufacture. An embodiment described below is aimed at getting around this problem.

In an embodiment shown in FIG. 4 the same parts and surfaces are shown at the same reference numerals as in FIG. 3 described above. The difference here begins with the step illustrated in FIGS. 4(d, e). At this step support means, e.g., in the form of blocks 22 having identical height $t_4$ is provided on transparent support member 16 before cementing the structure shown in FIG. 4(c). These blocks 22 have top sides 24 and inner sides 26 as shown in FIG. 4(e) illustrating the top view of support member 16 in which dotted lines show image forming zone 13, polished surface 11 of semiconductor member 10, and support surface 15. Blocks 22 are installed in such a manner that their inner sides 26 are within the area of support surface 15 (FIG. 4(e)). The height $t_4$ of blocks 22 (FIG. 4(d)) is chosen to be 5 to 15 μm greater than the thickness of the layer of the semiconductor member etched off on polished side 11 of semiconductor member 10 to form support surface 15. In this specific embodiment this can be done by using gauged blocks 22 of one and the same height and by placing them on the top side of support member 16 before applying cementing layer 14. When cementing layer 14 is applied, and the structure shown in FIG. 4(c) is placed on top sides 24 of blocks 22, support surface 15 of semiconductor member 10 bears against top sides 24 of blocks 22 so that thickness $t_5$ of cementing layer 14 (FIG. 4(f)) is determined by the difference between thickness $t_1$ of the etched-off layer of semiconductor member 10 and height $t_4$ of gauged blocks 22, i.e., $t_5=t_4-t_1$. This difference, which determines thickness of cementing layer 14, ranges from 5 to 15 μm. It has been found that this range of thickness of cementing layer 14 is an optimum range. A thickness of cementing layer 14 smaller than 5 μm cannot ensure an adequate strength of the cement bond. A thickness greater than 15 μm results in a poorer heat conductance of the cementing layer which causes an increase in the average temperature of the semiconductor member of the laser screen resulting in a lower efficiency of energy transformation.

When the cementing layer has been cured, the next step is to polish surface 17 of semiconductor member 10 (FIG. 4(f)) to obtain a structure shown in FIG. 4(g). The polishing operation is stopped at the top sides 24 of blocks 22. The end of polishing operation can be visually determined. It is however preferred that blocks 22 be made of a material which is harder than, or which is otherwise different from the material of semiconductor member 10. Such block can be made of sapphire, zirconia, Si, SiC and other like materials. With such different properties, if polishing is carried out by machining, the polishing operation can be stopped when resistance to machining suddenly increases in the former case. In the latter case, e.g., chemical and mechanical polishing is automatically stopped. Moreover parallelity of final surfaces of the semiconductor member is achieved automatically. If a laser screen or polishing plane is fastened in such manner the necessary resistance for polishing in one point of laser screen results in more intensive polishing of opposite side of semiconductor member with respect to the center of the laser screen. So if in the time of polishing only one block is opened up and a thickness of semiconductor member over an opposite block is too large that the hard opened block will decrease an intensity of polishing of semiconductor member near it and an intensity of polishing of semiconductor member over the opposite block will be increased. It results in an improvement of parallelity of surfaces of semiconductor member.

Reflecting mirror 18 is then applied to polished surface 17 of semiconductor member 10 after removal of blocks 22. Blocks 22 can be left before applying mirror 18. As a result, a laser screen is obtained which is shown in FIG. 4(h). It will be apparent that a gauged ring can be used instead of blocks 22 if image forming area 13 is round.

An embodiment shown in FIG. 5 differs from that shown in FIG. 4 only by the fact that blocks 28 of any size are first cemented to the top side of support member 16 as shown at 29 (FIG. 5 (d)) and their top sides 30 are then treated to obtain top sides 32 (FIG. 5(e)) to obtain the identical distance $t_4$ from the top sides of blocks 30 to the top side of support member 16 complying with the condition set forth in the description with reference to FIG. 4 above. The final steps of the method in this embodiment shown in FIGS. 5(f-h) are the same as described above with reference to FIG. 4, with the only difference that blocks 28 are not removed.

The following examples are given to illustrate practical implementation of the invention.

EXAMPLE 1

A wafer 1.5 mm thick and 50 mm in diameter was cut out of a single-crystal ingot of CdS with orientation (0001). The chalcogen side was ground and polished. An eight-layer mirror coating of alternating layers of SiO$_2$ and ZrO$_2$ was sputtered for a wavelength of 500 nm. The wafer was then dipped into an etching solution of 30 g of CrO$_3$ in 100 ml of concentrated HCl for 10 minutes, washed and dried. Four rectangular support members in the form of sapphire blocks of a size 3×3 mm and 1 mm thick were cemented to a sapphire support 10 thick and 60 mm in diameter oriented in (0001) plane by epoxy OK-72F(in Russia). The blocks were cemented outside a central rectangular area of a size of 30×40 sq. mm, along the sides of this area. The blocks were polished to obtain the total thickness of the block and cementing layer of 45 μm. The wafer was cemented to the support by epoxy OK-72F(in Russia) in such a manner that cement could not get between the surface of the blocks and the surface of the etched areas of the wafer. The opposite side of the wafer was then ground and polished by chemical and mechanical treatment automatically until thickness of the etched portions on all four sides was zero. A silver coating 0.08 μm thick was then applied to the polished side of the wafer.

The resulting laser screen had a semiconductor member of a size 30×40 sq. mm and 20 μm thick, and a cementing layer was 10 μm thick. Thickness of both semiconductor member (wafer) and cementing layer varied over the screen surface area by maximum 2 μm. The laser screen had high lasing uniformity and a service life over 1,000 hours. Fluctuations of lasing power over the screen were below 5% of the average value when the screen was excited at 150K with a scanning electron beam having an energy of electrons of 75 keV. Current density was 200 A/sq. cm, electron spot diameter was 15 μm, and electron beam scanning speed was of 10$^5$ cm/s. An evaluation of service life was made from an experiment in which a television picture was compressed 20 times along a direction of vertical sweeping and a time of falling of output light power up to 80% of former value was measured under controlling an average temperature of the laser screen at nearly 150° K. This time was multiplied by a factor of 20 for evaluation of service life.

Comparison was made with a prior art screen having the same total thickness of the wafer and cementing layer (30 μm), but with a strong taper (which is typical for conventional methods of making laser screens), with a change in thickness of the wafer of 20 μm from one edge to the other (from 5 to 25 μm) and a strong taper of the cementing layer. The laser screen according to the invention had an important advantage in terms of lasing uniformity and life, especially in operation at room temperature. Thus, the prior art laser screen working at room temperature degraded in a less than one hour of operation in a zone with the wafer thickness of 5 μm. It should be noted that after 5 hours of operation of the laser screen according to the invention lasing performance remained practically unchanged. During first five hours of continuous operation of the prior art laser screen lasing power fluctuated over the screen surface area with a two to three-fold deviation from the average level. This non-uniformity was as low as about 10% in the laser screen according to the invention.

EXAMPLE 2

A laser screen was made as described in Example 1, but a layer of 50 μm was etched off. Support plates were used which were polished to a thickness of 65 μm.

The resulting laser screen had a semiconductor member 50 μm thick, and the cementing layer was 15 μm thick. The screen had a somewhat longer service life than that described in Example 1 with a lower lasing efficiency at room temperature.

EXAMPLE 3

A laser screen was made as described in Example 1, but a layer of 30 μm was etched off. The support members or blocks were polished to a thickness of 35 μm.

The resulting laser screen had a semiconductor member 30 μm thick, and the cementing layer was 5 μm thick. The screen had a higher average lasing power under a quasi-continuous irradiation with an electron beam in comparison with the screen of Example 1, but service life was somewhat shorter at 80K and lasing efficiency at room temperature was lower.

EXAMPLE 4

A laser screen was made as described in Example 2, but four gauged blocks 65 μm thick of a size 3×6 sq. mm were used which were placed on the support before cementing them to the wafer as shown in FIG. 4. The blocks were made of sapphire which was much harder than the CdS wafer.

EXAMPLE 5

A laser screen was made as described in Example 2, but support plates of sapphire were used. Chemical and mechanical polishing of the second surface of the wafer was carried out automatically without continuous thickness control.

EXAMPLE 6

A laser screen was made as described in Example 5, but the wafer was cut out of an ingot of ZnSe with orientation (111). The partly transparent mirror was made for a wavelength of 470 nm, and the etching time was different.

EXAMPLE 7

A laser screen was made as described in Example 5, but the wafer was cut out of an ingot of CdS$_{0.5}$Se$_{0.5}$ with orientation (111). The partly transparent mirror was made for a wavelength of 620 nm.

All laser screens of Examples 1 through 7 had a longer service life and better lasing uniformity in comparison with the prior art.

Non-limiting explanatory specific embodiments have been described above. It is understood that various modifications and supplements may be made by those skilled in the art which do not go beyond the spirit and scope of the invention as defined in the attached claims.

We claim:

1. A method of making a laser having an image forming area and comprising an optical cavity having a reflecting mirror and a partly transparent mirror, a semiconductor member which has a first side and a second side opposite to said first side and which is positioned between said reflecting mirror and said partly transparent mirror, and a support and heat removing member made of a transparent material, said support member having a top side and being attached to said partly transparent mirror, said method comprising:

polishing said first side of said semiconductor member;

forming said partly transparent mirror of a material resistant to etching solutions on said first polished side of said semiconductor member, said partly transparent mirror having an outer surface and covering a part of the surface area of said first polished side of said semiconductor member surrounding said image forming area;

etching off a layer of said semiconductor member of a thickness of 20 to 50 μm on said first polished side of said semiconductor member to define a support surface of said semiconductor member surrounding said image forming area, said support surface being equally spaced from the outer surface of said partly transparent mirror;

attaching said support member to said outer surface of said partly transparent mirror;

polishing said second side of said semiconductor member; and forming said reflecting mirror on said second side of said semiconductor member.

2. A method of making a laser of claim 1, wherein a support means having a top side and inner sides is placed onto said top side of said support member, said inner sides of said support means being confined within the area of said support surface of said semiconductor member surrounding said image forming area, the top side of said support means being equally spaced from said top side of said support member.

3. A method of making a laser of claim 2, wherein said support means is made of a material which is harder than the material of said semiconductor member.

4. A method of making a laser of claim 2, wherein said support means comprises a plurality of gauged blocks positioned to surround said image forming area.

5. A method of making a laser of claim 4, wherein said support means is made of a material which is harder than the material of said semiconductor member.

6. A method of claim 5 where the support means is made of sapphire.

7. A method of claim 5 where the support means is made of SiC.

8. A method of claim 5 where the support means is made of Si.

9. A method of making a laser of claim 2, wherein said support means is attached to said top side of said support members, said top sides of said support means being machined until said top side of said support means is equally spaced from said top side of said support member.

10. A method of making a laser of claim 9, wherein said support means is made of a material which is harder than the material of said semiconductor member.

11. A method of making a laser of claim 2, wherein said support member is bonded to the outer surface of said partly transparent mirror by a cementing layer having a thickness of between 5 μm to 15 μm.

12. A method of making a laser of claim 4, wherein said support member is bonded to the outer surface of said partly transparent mirror by a cementing layer having a thickness of between 5 μm to 15 μm.

13. A method of making a laser of claim 12, wherein said support means is made of a material which is harder than the material of said semiconductor member.

14. A method of making a laser of claim 9, wherein said support member is bonded to the outer surface of said partly transparent mirror by a cementing layer having a thickness of between 5 μm to 15 μm.

15. A method of making a laser of claim 14, wherein said support means is made of a material which is harder than the material of said semiconductor member.

* * * * *

UNITED STATES PATENT AND TRADEMARK OFFICE
CERTIFICATE OF CORRECTION

PATENT NO. : 5,254,502
DATED : October 19, 1993
INVENTOR(S) : Vladmir I. Kozlovsky, Troisk, U.S.S.R.

It is certified that error appears in the above-indentified patent and that said Letters Patent is hereby corrected as shown below:

On the title page: Items

[75] Inventor: Vladimir I. Kozlovsky, Troitsk, Russia

[73] Assignees: Principia Optics, Inc., Los Angeles, California; P.N. Lebedev Institute of Physics, Moscow, Russia

[30] Foreign Application Priority Data: December 26, 1991 Russia N5016145/21

[56] References Cited

U.S. PATENT DOCUMENTS 3,558,956 1/1971 Basov et al.

Signed and Sealed this

Twenty-sixth Day of July, 1994

*Attest:*

BRUCE LEHMAN

*Attesting Officer*     *Commissioner of Patents and Trademarks*